United States Patent
Matsuo et al.

(10) Patent No.: US 7,365,012 B2
(45) Date of Patent: Apr. 29, 2008

(54) ETCHING METHOD, A METHOD OF FORMING A TRENCH ISOLATION STRUCTURE, A SEMICONDUCTOR SUBSTRATE AND A SEMICONDUCTOR APPARATUS

(75) Inventors: Hiroyuki Matsuo, Tino (JP); Toshiki Nakajima, Suwa (JP); Kunihiro Miyazaki, Oita (JP)

(73) Assignee: Seiko Epson Corporation (JP)

( * ) Notice: Subject to any disclaimer, the term of this patent is extended or adjusted under 35 U.S.C. 154(b) by 60 days.

(21) Appl. No.: 11/201,266

(22) Filed: Aug. 10, 2005

(65) Prior Publication Data
US 2006/0033178 A1    Feb. 16, 2006

(30) Foreign Application Priority Data
Aug. 13, 2004    (JP)    ............................. 2004-236181

(51) Int. Cl.
*H01L 21/302* (2006.01)

(52) U.S. Cl. .................. 438/689; 438/689; 438/690; 438/700; 216/2; 216/58; 216/74; 216/75; 216/99; 216/97; 134/1.3; 134/2

(58) Field of Classification Search ................ 438/689; 216/2; 134/1.3
See application file for complete search history.

(56) References Cited

U.S. PATENT DOCUMENTS 5,721,173 A * 2/1998 Yano et al. ................. 438/424

5,868,855 A * 2/1999 Fukazawa et al. ........... 134/1.3
6,348,157 B1    2/2002 Ohmi
2001/0034130 A1    10/2001 Kusakabe et al.
2003/0205553 A1* 11/2003 Nakahara et al. ............. 216/2

FOREIGN PATENT DOCUMENTS

| JP | 10-098018 | 4/1998 |
|---|---|---|
| JP | 10-340876 | 12/1998 |
| JP | 11-176792 | 7/1999 |
| JP | 2000-031116 | 1/2000 |
| JP | 2001-44167 | 2/2001 |
| JP | 2001-237308 | 8/2001 |
| JP | 2002-100568 | 4/2002 |

(Continued)

OTHER PUBLICATIONS

Communication from Korean Patent Office re: related application

*Primary Examiner*—Maki A. Angadi
(74) *Attorney, Agent, or Firm*—Harness, Dickey & Pierce, P.L.C.

(57) ABSTRACT

An etching method of subjecting a base material to an etching process using an etching agent containing hydrogen fluoride and ozone is disclosed. The base material has a first region constituted from silicon as a main material and a second region constituted from $SiO_2$ as a main material. The etching method includes the steps of: preparing the base material; and supplying the etching agent onto the base material to form a step between the first and second regions using a feature that an etching rate of silicon by the etching agent is higher than an etching rate of $SiO_2$ by the etching agent, so that the height of the surface of the first region is lower than the height of the surface of the second region.

17 Claims, 9 Drawing Sheets

FOREIGN PATENT DOCUMENTS

| | | |
|---|---|---|
| JP | 2003-292403 | 3/2003 |
| JP | 2003-173998 | 6/2003 |
| JP | 2001-218085 | 7/2003 |
| KR | 2000-0003963 | 1/2000 |
| KR | 2002-0024514 | 3/2002 |
| WO | WO 02/03432 A2 | 1/2002 |

* cited by examiner (a)

(b)

ETCHING METHOD, A METHOD OF FORMING A TRENCH ISOLATION STRUCTURE, A SEMICONDUCTOR SUBSTRATE AND A SEMICONDUCTOR APPARATUS

CROSS-REFERENCE TO RELATED APPLICATION

This application claims priority to Japanese Patent Application No. 2004-236181 filed Aug. 13, 2004, which is hereby expressly incorporated by reference herein in its entirety.

FIELD OF THE INVENTION

The present invention relates to an etching method, a method of forming a trench isolation structure, a semiconductor substrate and a semiconductor apparatus.

BACKGROUND OF THE INVENTION

A demand for high density and high integration of semiconductor devices in a semiconductor apparatus tends to heighten. In order to respond such a demand, miniaturization of a semiconductor device itself, and miniaturization of a device isolation region for isolating adjacent semiconductor devices tend to become increasingly important. Heretofore, as a method of forming a device isolation region, a LOCOS (Local Oxidation of Silicon) method in which an oxide film to become a device isolation region is formed has been generally utilized.

However, in the case where an oxide film having a minute pattern is formed using the LOCOS method, device isolation becomes incomplete because oxidation in a thickness direction does not proceed sufficiently. Further, in the case of forming an oxide film that has a sufficient thickness for isolating devices, the device isolation region spreads more than a predetermined region because oxidation in a lateral direction proceeds as well as the oxidation in the thickness direction. For this reason, the miniaturization of the device isolation region in the LOCOS method has its own limitation. Thus, an STI (Shallow Trench Isolation) method attracts attention as a device isolation technology in place of the LOCOS method (for example, see Japanese Laid-Open Patent Application No. 2001-237308).

In the STI method, a device isolation structure (trench isolation structure) is formed by forming trenches on a silicon substrate and filling a $SiO_2$ film (insulating material) in each of the trenches. In this case, the $SiO_2$ film is formed by protruding the surface of the $SiO_2$ film so that the surface thereof is higher than the surface of the silicon substrate.

Heretofore, a trench isolation structure by the STI method is formed as follows. FIG. 8 is a drawing (vertical cross-sectional view) for explaining a conventional method of forming a semiconductor apparatus.

First, as shown in FIG. 8(a), apad oxide film 200 is formed on a silicon substrate 100 by subjecting the surface of the silicon substrate 100 to a thermal oxidation process.

Next, as shown in FIG. 8(b), a SiN film 300 is formed on the pad oxide film 200 by means of a CVD method. This SiN film 300 functions as a stopper when polishing the $SiO_2$ film by means of a CMP (Chemical Mechanical Polishing) method at a post-process.

Next, as shown in FIG. 8(c), a resist layer 400 is formed on the SiN film 300 with a pattern corresponding to a region for forming devices (device forming region) by means of a photolithography method.

Next, as shown in FIG. 8(d), the SiN film 300 and the pad oxide film 200 are subjected to a dry etching process using the resist layer 400 as a mask, whereby the pad oxide film 200 and the SiN film 300 are patterned with a shape corresponding to the device forming region. The silicon substrate 100 is then subjected to an etching process using the patterned SiN film 300 as a mask, thereby forming trenches 500.

Next, as shown in FIG. 8(e), a $SiO_2$ film 600 is formed on the silicon substrate 100 on which the pad oxide film 200, the SiN film 300 and the trenches 500 are formed by means of a plasma CVD method or the like so that the $SiO_2$ film 600 is filled in each of the trenches 500.

Next, as shown in FIG. 8(f), the $SiO_2$ film 600 is polished and flattened by means of the CMP method using the SiN film 300 as a stopper. Thus, the height of the surface of the $SiO_2$ film 600 on the trench 500 becomes the height substantially corresponding with the height of the surface of the SiN film 300.

Next, as shown in FIG. 8(g), the SiN film 300 is eliminated by means of a wet etching process with a heated phosphoric acid.

Next, as shown in FIG. 8(h), the pad oxide film 200 is eliminated by means of a wet etching process with a fluoride acid.

Through the steps described above, the surface of the $SiO_2$ film 600 in each of the trenches 500 becomes higher than the surface of the silicon substrate 100, thereby forming trench isolation structures (device isolation regions). The trench isolation structure makes a plurality of regions for forming devices to be separately formed on the surface of the silicon substrate 100.

Now, in the method described above, in order to flatten the $SiO_2$ surface when flattening the $SiO_2$ film 600 by means of the CMP method, the surface of the SiN film 300 is completely exposed, and the $SiO_2$ film 600 is polished somewhat excessively. When the $SiO_2$ film 600 is excessively polished, so-called dishing occurs at the step when the surface of the SiN film 300 is exposed and both the $SiO_2$ film 600 and the SiN film 300 are polished at the same time. The dishing occurs because polishing does not proceed evenly between a narrow portion and a wide portion of the device isolation pattern due to a difference between the etching rates therefor.

Since the $SiO_2$ film 600 is excessively polished at a relatively wide device isolation region in the dishing, isolation between the adjacent devices separated with such a wide device isolation region becomes incompletely, and/or a focus gap in the photolithography method occurs when forming gate electrodes on the $SiO_2$ film 600 by patterning poly-silicon or the like, whereby failure of patterning formation occurs. As a result, there is a problem that characteristics of the semiconductor apparatus become impaired.

Further, in the method described above, the pad oxide film 200 is eliminated by means of a wet etching process using a hydrofluoric acid. In this regard, etching proceeds isotropically in the wet etching process using a hydrofluoric acid. For this reason, as shown in FIG. 8(h), an end portion of the $SiO_2$ film 600 is subjected to etching, and as a result, concave portions of the $SiO_2$ film 600 are generated at the boundaries between the $SiO_2$ film 600 and the silicon substrate 100, whereby corner portions 501 are formed at the boundaries between the $SiO_2$ film 600 and the silicon substrate 100.

In the case where, for example, a transistor is configured within each of the device forming regions of the silicon substrate 100 described above, a gate electrode is constructed to cover the corner portions 501. Thus, there is a problem that a leakage current occurs due to concentration of an electric field at the corner portions 501. In order to solve this problem, countermeasures such as round oxidation in which the corner portion 501 is shaped of round by means of a thermal oxidation process are taken (or adopted). However, since the number of manufacturing processes (or steps) for trench isolation structure is increased by providing such a process, manufacturing efficiency for the trench isolation structure tends to fall down.

Moreover, in the method described above, since the SiN film 300 is used as a stopper for the CMP method, the steps of forming and eliminating the SiN film 300 are required. This makes the number of manufacturing processes be increased.

SUMMARY OF THE INVENTION

It is therefore an object of the present invention to provide an etching method by which a step between first and second regions can be formed easily and precisely while preventing a gap from being generated at the boundary between the first region constituted from silicon as a main material and the second region constituted from $SiO_2$ as a main material.

Further, it is another object of the present invention to provide a method of forming a trench isolation structure to which the etching method is applied, a semiconductor substrate on which the trench isolation structure is formed by means of the method of forming a trench isolation structure, and a semiconductor apparatus provided with the semiconductor substrate which has high reliability.

In order to achieve the above object, in one aspect of the present invention, the present invention is directed to an etching method of subjecting a base material to an etching process using an etching agent containing hydrogen fluoride and ozone. The base material has a first region constituted from Si as a main material and a second region constituted from $SiO_2$ as a main material. The etching method includes the steps of:

preparing the base material; and supplying the etching agent onto the base material to form a step between the first and second regions using a feature that an etching rate of Si by the etching agent is higher than an etching rate of $SiO_2$ by the etching agent, so that the height of the surface of the first region is lower than the height of the surface of the second region.

Thus, it is possible to form a step between the first and second regions easily and precisely while preventing a gap from being generated at the boundary between the first region constituted from silicon as a main material and the second region constituted from $SiO_2$ as a main material. Further, since the height of a step to be formed (that is, distance between the surfaces of the two regions) can be adjusted precisely, it is possible to ensure stability of any steps that such a step may influence (for example, a photolithography process at a subsequent step, or the like).

In the etching method of the present invention, it is preferable that the etching agent includes an etchant containing hydrogen fluoride and ozone.

This makes it easy to treat the etching agent. Further, it is possible to prevent the surface of the first region from getting rough suitably.

In the etching method of the present invention, it is preferable that, in the case where the etching rate of Si by the etchant is defined as $R_1$ and the etching rate of $SiO_2$ by the etchant is defined as $R_2$, then $R_1$ and $R_2$ satisfy the relation: $R_1/R_2$ is in the range of 1.2 to 200.

This makes it possible to control the step easily while preventing the etching rate from lowering.

In the etching method of the present invention, it is preferable that in the etching agent supplying step the concentration of hydrogen fluoride in the etchant is in the range of 0.05 to 5% by weight.

This makes it possible to adjust the ratio between the etching rates of Si and $SiO_2$ ($R_1/R_2$).

In the etching method of the present invention, it is preferable that in the etching agent supplying step the concentration of ozone in the etchant is in the range of 1 to 50 ppm.

This makes it possible to adjust the ratio between the etching rates of Si and $SiO_2$ ($R_1/R_2$).

In the etching method of the present invention, it is preferable that in the etching agent supplying step the temperature of the etchant is in the range of 0 to 100° C.

This makes it possible to form the step surely and with high dimensional accuracy while preventing the etching rate from lowering.

In another aspect of the present invention, the present invention is directed to a method of forming a trench isolation structure on the surface of a semiconductor substrate. The semiconductor substrate is constituted from Si as a main material. The method includes the steps of:

a first step at which trenches are formed on the surface of the semiconductor substrate;

a second step at which an insulating material is supplied onto the surface of the semiconductor substrate to fill in the trenches with the insulating material, the insulating material being constituted from $SiO_2$ as a main material;

a third step at which the side of the surface of the semiconductor substrate is flattened by eliminating a part of the insulating material;

a fourth step at which the surface of the semiconductor substrate is exposed by eliminating the insulating material by a substantially constant thickness; and a fifth step at which a step is formed between the semiconductor substrate and the insulating material by subjecting the surface of the semiconductor substrate to an etching process by means of the etching method defined by claim 1 to obtain the trench isolation structure.

This makes it possible to form the trench isolation structure easily and precisely.

In the method of forming a trench isolation structure according to the present invention, it is preferable that the fifth step includes the step of adjusting the height of the step to be formed between the semiconductor substrate and the insulating material by setting conditions of at least one of the concentration of hydrogen fluoride in the etching agent, the concentration of ozone in the etching agent, the temperature of the etching agent and a processing time by the etching agent.

This makes it possible to insulate the adjacent semiconductor devices formed in the plurality of device forming regions surely.

In the method of forming a trench isolation structure according to the present invention, it is preferable that the elimination of the insulating material at the third step is carried out by means of a CMP (Chemical Mechanical Polishing) method.

According to the CMP method, it is possible to eliminate the insulating material constituted from $SiO_2$ as a main material efficiently.

In the method of forming a trench isolation structure according to the present invention, it is preferable that the elimination of the insulating material at the fourth step is carried out using an etching agent containing hydrogen fluoride.

This makes it possible to eliminate the insulating material constituted from SiO$_2$ as a main material efficiently.

In the method of forming a trench isolation structure according to the present invention, it is preferable that the etching agent further contains ozone.

In the method of forming a trench isolation structure according to the present invention, it is preferable that the fourth step and the fifth step are carried out using the same etching agent.

This makes it possible to simplify the manufacturing process, and it is possible to form the trench isolation structure with a shorter time.

In the method of forming a trench isolation structure according to the present invention, it is preferable that the method further includes the step of oxidizing the surface of the semiconductor substrate and/or the step of forming an oxide film on the surface of the semiconductor substrate prior to the first step. In this case, the oxide film is constituted from SiO$_2$ as a main material.

This makes it possible to form the trench while protecting the surface of the semiconductor substrate (that is, Si substrate).

In the method of forming a trench isolation structure according to the present invention, it is preferable that the surface orientation of the semiconductor substrate is Si(100).

This makes it possible to prevent the surface of the semiconductor substrate (Si substrate) from getting rough suitably. Further, the etching to the semiconductor substrate easily proceeds in the thickness direction thereof. Therefore, it is possible to form the trench isolation structure more easily and more surely.

In still another aspect of the present invention, the present invention is directed to a semiconductor substrate constituted from Si as a main material. The semiconductor substrate includes:

a trench isolation structure formed on the surface of the semiconductor substrate using the method of forming a trench isolation structure according to the present invention described above; and a plurality of regions for forming devices, the regions being separately formed by means of the trench isolation structure.

This makes it possible to obtain a semiconductor substrate which can insulate the adjacent semiconductor devices formed in the plurality of device forming regions surely.

In yet another aspect of the present invention, the present invention is directed to a semiconductor apparatus. The semiconductor apparatus includes:

the semiconductor substrate of the present invention described above; and a plurality of semiconductor devices respectively formed in the regions for forming devices of the semiconductor substrate.

This makes it possible to obtain a semiconductor apparatus with high reliability.

BRIEF DESCRIPTION OF THE DRAWINGS

The foregoing and other objects, features and advantages of the present invention will become more readily apparent from the following detailed description of preferred embodiments of the present invention which proceeds with reference to the accompanying drawings.

DETAILED DESCRIPTION OF THE INVENTION

Preferred embodiments of an etching method, a method of forming a trench isolation structure, a semiconductor substrate and a semiconductor apparatus will now be described in detail with reference to the appending drawings.

(Configuration of Semiconductor Apparatus)

Figure 1:
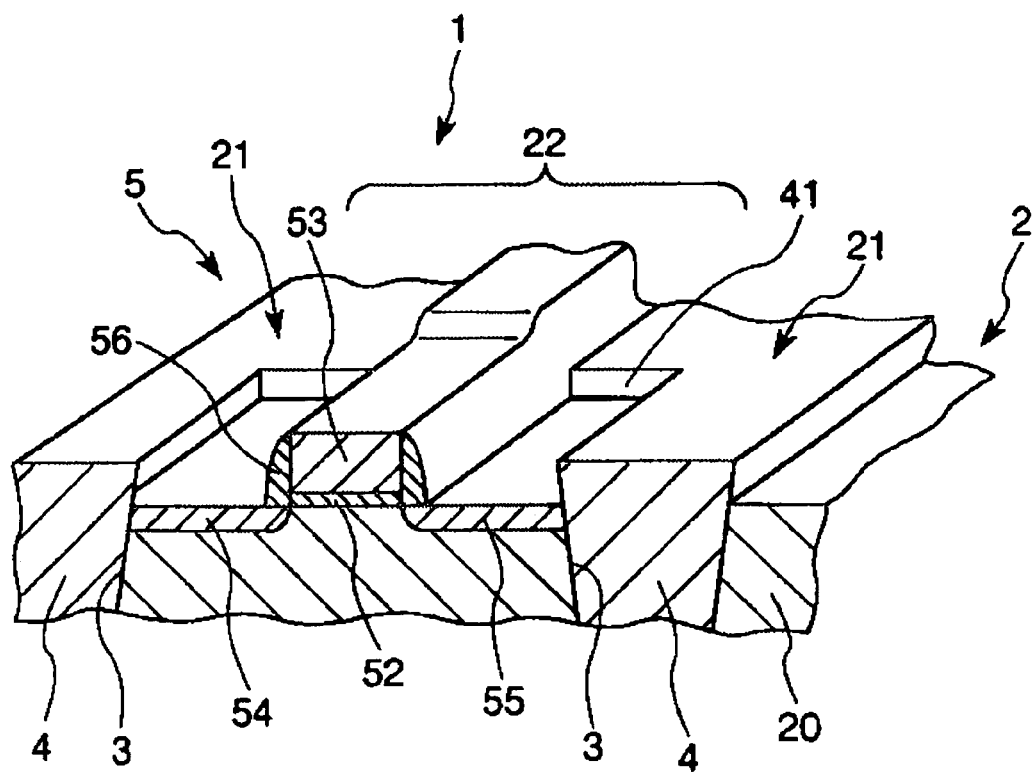
FIG. 1 is a perspective view which schematically shows a semiconductor apparatus in an embodiment of the present invention.

A semiconductor apparatus of the present invention will first be described. FIG. 1 is a perspective view which schematically shows a semiconductor apparatus in an embodiment of the present invention. Now, in following explanations using FIG. 1, for convenience of explanation, an upper side and lower side in FIG. 1 are referred to as "upper" and "lower", respectively.

The semiconductor apparatus 1 shown in FIG. 1 is provided with a semiconductor substrate (semiconductor substrate of the present invention) 2, and a semiconductor device 5. In the semiconductor substrate 2, trench isolation structures (that is, device isolation regions) 21 are formed on the surface 23 of a substrate 20 constituted from silicon as a main material. The trench isolation structure 21 is constructed from insulating portions 4 that fill in trenches 3 formed on the surface 23 of the substrate 20 and protrude from the surface 23 of the substrate 20. The insulating portion 4 is constituted from an insulating material containing SiO$_2$ (silicon oxide) as a main material. This makes it possible to prevent semiconductor devices 5 adjacent via the insulating portion 4 from conducting each other.

In the present embodiment, a MOS transistor (MOSFET) as the semiconductor device 5 is formed (provided) in each of regions 22 for forming devices. More specifically, by injecting (or introducing) impurity ions into predetermined portions in the vicinity of the surface 23 of the substrate 20 (in the configuration shown in FIG. 1, regions corresponding to a source 54 and a drain 55), a pair of impurity diffusion layers are formed so as to be spaced each other. The impurity diffusion layers functions as the source 54 and the drain 55 in the MOS transistor, respectively.

A source electrode and a drain electrode are connected to the source 54 and the drain 55, respectively (not shown in the drawings). Further, a gate insulating film 52 and a gate electrode 53 are formed in a laminated manner at the position corresponding to a channel region, that is, between the source 54 and the drain 55. Moreover, a side surface insulating film 56 is formed on each side of the gate insulating film 52 and the gate electrode 53.

In such a MOS transistor, by changing a voltage value to be applied to the gate electrode 53, it is possible to control the amount of current flowing between the source 54 and the drain 55.

In other words, even though voltage is applied between the source 54 and the drain 55 in an OFF state in which no voltage is applied to the gate electrode 53, no current flow between the source 54 and the drain 55 at this time. On the other hand, in an ON state in which voltage having a predetermined voltage value more than a threshold voltage value is applied to the gate electrode 53, an electrical charge is induced on the portion of the substrate 20 that faces the gate insulating film 52, whereby the channel region (that is, flow path of carrier) is formed. When voltage is applied between the source 54 and the drain 55 in this condition, current flows through the channel region.

In the semiconductor apparatus 1 described above, in addition to the MOS transistor, for example, various devices such as a diode element, a capacitive element (capacitor), and a resistive element (resistor) may be formed in other device forming regions 22 of the semiconductor substrate 2.

The semiconductor apparatus 1 can be suitably used in (or applied to), for example, various electronic apparatuses such as personal computers (laptop type, or mobile type personal computer), ink jet type ejection apparatuses (for example, ink jet printer), televisions, video cameras, digital still cameras, videotape recorders, car navigation devices, portable telephones (mobile phones), pagers, electronic notebooks (including those having communication functions), electronic dictionaries, pocket calculators, electronic game devices, word processors, work stations, television telephones, television monitors for crime prevention, electronic binoculars, POS (point-of-sale) terminals, medical devices (electronic thermometers, blood pressure meters, blood sugar meters, electrocardiogram measuring devices, ultrasound diagnostic devices, electronic endoscopes, for example), fish finders, various measurement devices, gauges (gauges for vehicles, airplanes, ships and the like, for example), flight simulators, and the like.

(Method of Manufacturing Semiconductor Apparatus)

Next, a method of manufacturing the semiconductor apparatus 1 shown in FIG. 1 will be described. The semiconductor apparatus 1 shown in FIG. 1 is obtained by manufacturing a semiconductor substrate 2 by means of the etching method of the present invention and respectively forming semiconductor devices 5 in the device forming regions 22 of the semiconductor substrate 2. Hereinafter, a detailed description will be given for the method of manufacturing the semiconductor apparatus 1.

<<First Manufacturing Method>>

Figure 2:
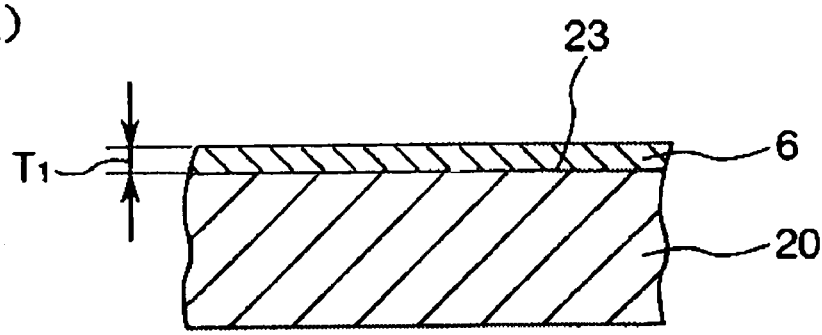
FIG. 2 is a drawing (vertical cross-sectional view) for explaining a first method of forming the semiconductor apparatus shown in FIG. 1.
Figure 2:
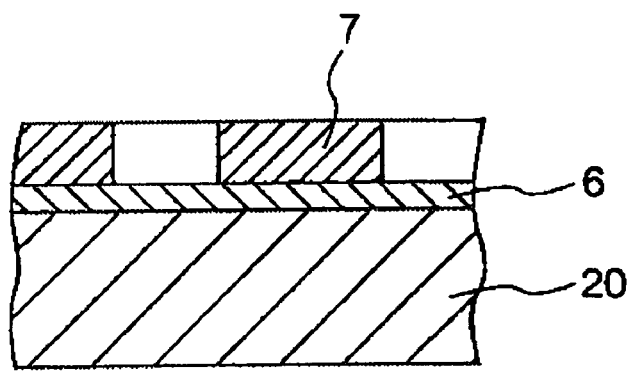
Figure 2:
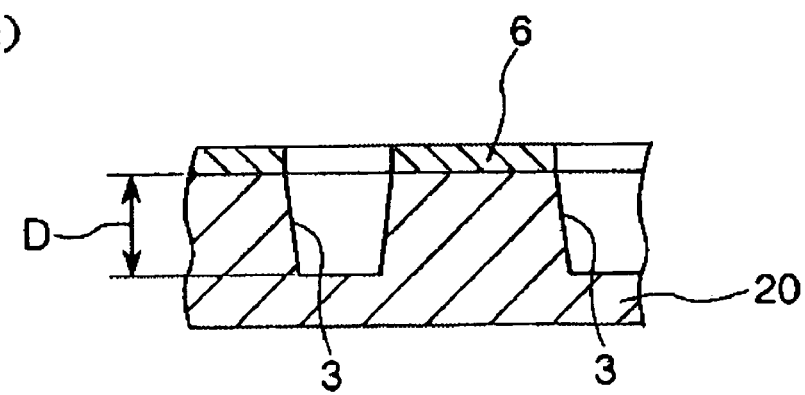
Figure 2:
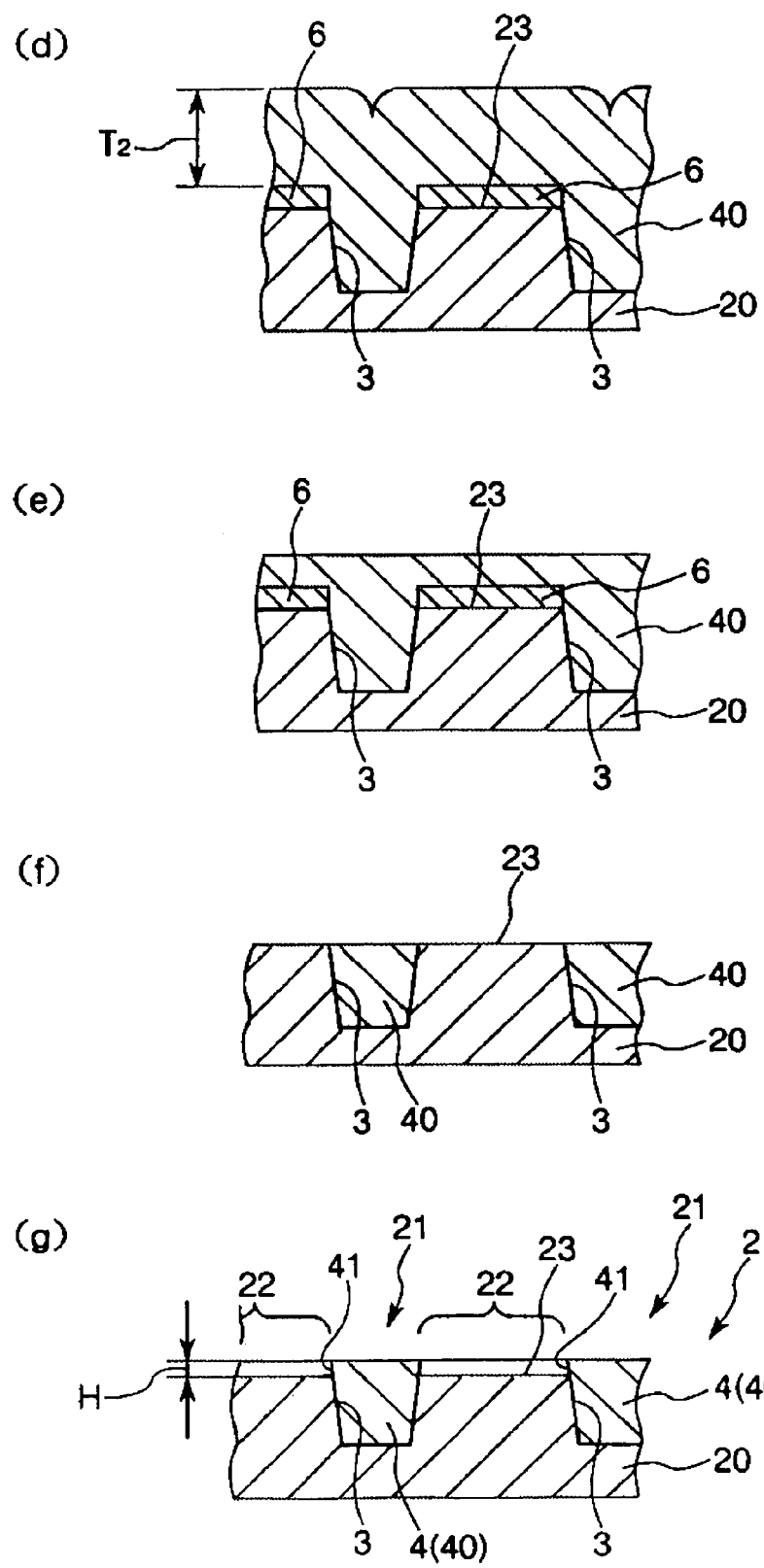

An explanation will now be given for a first manufacturing method of the semiconductor apparatus 1. FIG. 2 is a drawing (vertical cross-sectional view) for explaining a first method of forming the semiconductor apparatus shown in FIG. 1. Now, in following explanations using FIG. 2, for convenience of explanation, an upper side and lower side in FIG. 2 are referred to as "upper" and "lower", respectively.

<1A> Step of Forming Pad Oxide Film

First, a substrate 20 constituted from silicon as a main material is prepared. As shown in FIG. 2(*a*), a pad oxide film (sacrificed film) 6 constituted from $SiO_2$ as a main material is then formed on the surface 23 of the substrate 20. The pad oxide film 6 is provided for protecting the surface 23 of the substrate 20, for example.

The average thickness $T_1$ of the pad oxide film 6 to be formed is not particularly limited, and it is preferable that the average thickness $T_1$ is in the range of about 5 to 30 nm. The pad oxide film 6 may be formed by means of a method of oxidizing the surface 23 of the substrate 20, and/or a method of depositing a film material constituted from $SiO_2$ as a main material on the surface 23 of the substrate 20. In this regard, these methods may be carried out together.

As the method of oxidizing the surface 23 of the substrate 20, a method of subjecting the surface 23 of the substrate 20 to thermal treatment in which the surface 23 is heated at 750 to 1,100° C. for 5 to 50 minutes may be mentioned. On the other hand, as a method of depositing a film material constituted from $SiO_2$ as the main material on the surface 23 of the substrate 20, for example, chemical vapor deposition methods such as a plasma CVD method, a thermal CVD method, a laser CVD method may be utilized. In this regard, since the pad oxide film 6 is provided if necessary, it can be omitted.

<2A> Step of Forming Trench (First Step)

Next, by applying a resist material on the pad oxide film 6 and then exposing and developing the resist material via a mask, as shown in FIG. 2(*b*), a resist layer 7 shaped of having openings respectively corresponding to device forming regions 22 is formed. The pad oxide film 6 and the substrate 20 are subjected to an etching process using the resist layer 7 as the mask, and the resist layer 7 is then eliminated. Thus, as shown in FIG. 2(*c*), trenches (concave-portions) 3 are formed. In this regard, the trenches 3 may be formed by eliminating the resist layer 7 after subjecting the pad oxide film 6 to an etching process and then subjecting the substrate 20 to an etching process using the pad oxide film 6 as the mask.

As an etching method, for example, various dry etching methods such as a plasma etching method, a reactive ion etching method, a beam etching method, a photo-assist etching method, and a wet etching method may be mentioned. In particular, it is preferable to use a dry etching method having high anisotropy.

Further, since the depth D of the trench 3 from the surface 23 of the substrate 20 somewhat changes in accordance with the type of semiconductor apparatus or the like, it is not particularly limited. In the present embodiment, it is preferable that the depth D of the trench 3 is in the range of about 50 to 1,000 nm, and more preferably it is in the range of about 200 to 600 nm. In this regard, the desired depth D may be set in accordance with the amount of etching of the substrate 20 when forming a step 41 at subsequent process.

<3A> Step of Supplying Insulating Material (Second Step)

Next, as shown in FIG. 2(*d*), an insulating material 40 constituted from $SiO_2$ as a main material is supplied onto the substrate 20 so as to fill in each of the trenches 3. The insulating material 40 is supplied so that it fills at least in each of the trenches 3, and that the surface of the insulating material 40 is higher than the surface 23 of the substrate 20, and that the surface of the insulating material 40 can be flattened at the next flattening step.

It is preferable that the insulating material 40 is supplied so that the average thickness $T_2$ at the portion except for inside of each of the trenches 3 is more than 100 nm. More preferably the average thickness $T_2$ is in the range of about 200 to 1,000 nm, and further more preferably it is in the range of about 350 to 600 nm. As a method of supplying the insulating material 40, for example, various chemical vapor deposition (CVD) methods such as a plasma CVD method, a thermal CVD method, a laser CVD method may be utilized.

<4A> Step of Flattening (Third Step)

Next, as shown in FIG. 2(e), the surface of the insulating material 40 is flattened by eliminating a part of the insulating material 40. The insulating material 40 can be eliminated by means of any one of a chemical mechanical polishing (CMP) method and the like in addition to the etching methods mentioned in the step <2A> described above. In particular, it is preferable to eliminate the insulating material 40 by means of the CMP method. According to the CMP method, it is possible to eliminate the insulating material 40 efficiently. Further, it is possible to flatten the surface of the insulating material 40 precisely.

<5A> Step of Exposing Substrate (Fourth Step)

Next, as shown in FIG. 2(f), the surface 23 of the substrate 20 is exposed by eliminating the insulating material 40 and the pad oxide film 6 with a substantially constant thickness. The insulating material 40 and the pad oxide film 6 are eliminated using an etchant (etching agent) including hydrogen fluoride, for example. Since solubility of $SiO_2$ in such an etchant is high, it is possible to eliminate the insulating material 40 and the pad oxide film 6 efficiently.

Although the concentration of hydrogen fluoride in the etchant somewhat changes in accordance with other conditions for the etchant, it is preferable that the concentration of hydrogen fluoride is in the range of about 0.05 to 5% by weight, and more preferably it is in the range of about 0.1 to 2% by weight. In the case where the concentration of hydrogen fluoride becomes too low, there is fear that the speed of eliminating the insulating material 40 and the pad oxide film 6 lowers extremely. On the other hand, in the case where the concentration of hydrogen fluoride becomes too high, there is fear that the surface 23 of the exposed substrate 20 gets rough, or the surface of the insulating material 40 is extremely lower than the surface 23 of the substrate 20 because it is impossible to control the etching amount accurately due to highness of the etching rate.

Hydrogen fluoride can be dissolved in a solvent used in such an etchant. Any solvent may be used in such an etchant as long as the solvent has a relatively low boiling point. As such a solvent, for example, various kinds of water such as distilled water, ion-exchange water, pure water, ultrapure water, and reverse osmosis water; lower alcohols such as methanol and ethanol, acetone, ethyl and ethyl acetate may be mentioned. One kind of them or a combination of two or more kinds of these elements can be utilized. It is preferable that any one including water among them is used as the solvent. This makes it possible to improve the etching rate to $SiO_2$ further.

Further, in the case where the concentration of hydrogen fluoride in the etchant is restricted within the range described above, it is preferable that the temperature of the etchant when eliminating the insulating material 40 and the pad oxide film 6 is in the range of about 20 to 50° C. In particular, it is preferable that the etching process is carried out while the temperature of the etchant is held at a state in which the temperature is substantially constant within the range described above (that is, a change of the temperature is small). Thus, it is possible to eliminate the insulating material 40 and the pad oxide film 6 more efficiently.

Under the conditions for the etching process described above, the etchant is brought into contact with the insulating film 40 and the pad oxide film 6 until the surface 23 of the substrate 20 is exposed.

In this regard, although the case where the etchant containing hydrogen fluoride is used as an etching agent has been described in the present embodiment, a gas including hydrogen fluoride (hydrogen fluoride gas) can be used as the etching agent. In this case, from the point of view to heighten the etching rate to $SiO_2$, it is preferable to mix water vapor in the gas used as the etching agent.

<6A> Step of Forming Step (Fifth Step)

Next, the surface 23 of the substrate 20 is subjected to an etching process by means of the etching method of the present invention. The etching method of the present invention uses an etchant (that is, etching agent) containing hydrogen fluoride and ozone, and uses a feature that an etching rate of silicon by the etching agent is higher than an etching rate of $SiO_2$ by the etching agent.

The difference between these etching rates allows the substrate 20 (that is, a first region constituted from silicon as a main material) to be etched more quickly than the insulating material 40 (that is, a second region constituted from $SiO_2$ as a main material) is. Thus, as shown in FIG. 2(g), a plurality of insulating portions 4 (this is, trench isolation structure 21) and a plurality of device forming regions 22 each partitioned by the adjacent insulating portions 4 are formed. In this regard, the surface of the insulating portion 4 is higher than the surface of the device forming region 22, and therefore a step 41 is formed between the adjacent first and second regions 4 (or 21) and 22.

The etching process by the etchant containing hydrogen fluoride and ozone has a large selection ratio between the substrate 20 constituted from silicon and the insulating portions 4 constituted from $SiO_2$, and therefore it is difficult for the etching to proceed to the insulating portions 4. For this reason, it is possible to form the step at each of boundaries between the insulating portions 4 and the substrate 20. In other words, it is possible to prevent corner portions from being formed at the boundaries between the insulating portions 4 and the substrate 20. This makes it possible to omit a step such as round oxidation that has been carried out in a conventional etching method, and it is possible to simplify the method of manufacturing the semiconductor apparatus 1.

Figure 3:
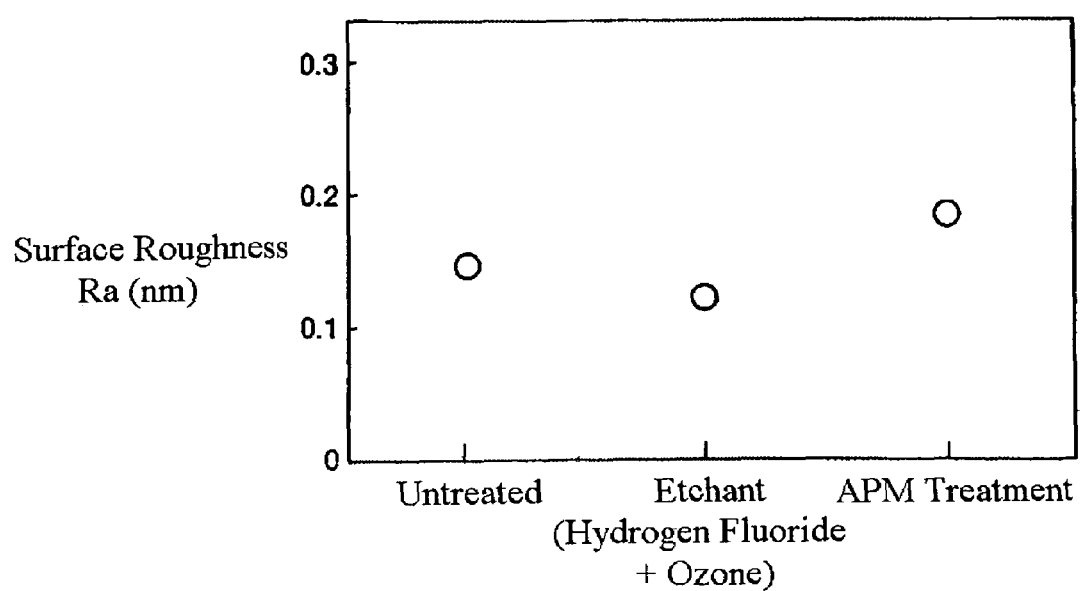
FIG. 3 is a graph which shows relation between surface roughness Ra of an untreated substrate and a treated substrate.

Further, such an etchant also has a feature that it is hard for the etchant to roughen the surface 23 of the substrate 20 (that is, device forming regions 22). FIG. 3 is a graph which shows surface roughness Ra of an untreated substrate 20, surface roughness Ra of an treated substrate 20 that is subjected to an etching process at 25° C. for 10 minutes with an etchant containing hydrogen fluoride of 0.25% by weight and ozone of 10 ppm, and surface roughness Ra of an treated substrate 20 that is subjected to a cleaning process at 50° C. for 10 minutes with mixed liquid (APM) containing ammonia water, hydrogen peroxide water and pure water. As shown in FIG. 3, the surface roughness Ra of the substrate 20 tends to be increased after the process with APM (mixed liquid containing ammonia water, hydrogen peroxide water and pure water), while the surface roughness Ra of the substrate 20 tends to be decreased after the etching process with the etchant containing hydrogen fluoride and ozone.

Therefore, by using the etchant containing hydrogen fluoride and ozone, surface morphology of the surface 23 of the device forming region 22 becomes extremely high.

Further, in the case of using such an etchant, it is preferable that the surface orientation of the substrate 20 is particularly Si(100) among various types of surface orientations of silicon. Thus, the etching process for the substrate 20 proceeds in the thickness direction thereof easily, and this makes it possible to form the steps 41 more easily and surely.

It is preferable that the etching rates of the substrate 20 and the insulating material 40 by the etchant are set as follows, for example. Namely, in the case where the etching rate of the substrate 20 (that is, silicon) by the etchant is defined as $R_1$ and the etching rate of the insulating material 40 (that is, $SiO_2$) by the etchant is defined as $R_2$, it is preferable that $R_1$ and $R_2$ satisfy the relation: $R_1/R_2$ is in the range of about 1.2 to 200. More preferably, $R_1$ and $R_2$ satisfy the relation: $R_1/R_2$ is in the range of about 3 to 30. In the case where $R_1/R_2$ is too small, a long time is required to form the steps 41 between the substrate 20 and the insulating material 40, and therefore the manufacturing efficiency of the semiconductor apparatus 1 may be lowered. On the other hand, in the case where $R_1/R_2$ is too large, the etching of the substrate 20 proceeds too quickly, and as a result, it may be difficult to control the height of the step 41 (that is, the distance between the surface of the device forming region 22 and the surface of the insulating material 4).

Figure 4:
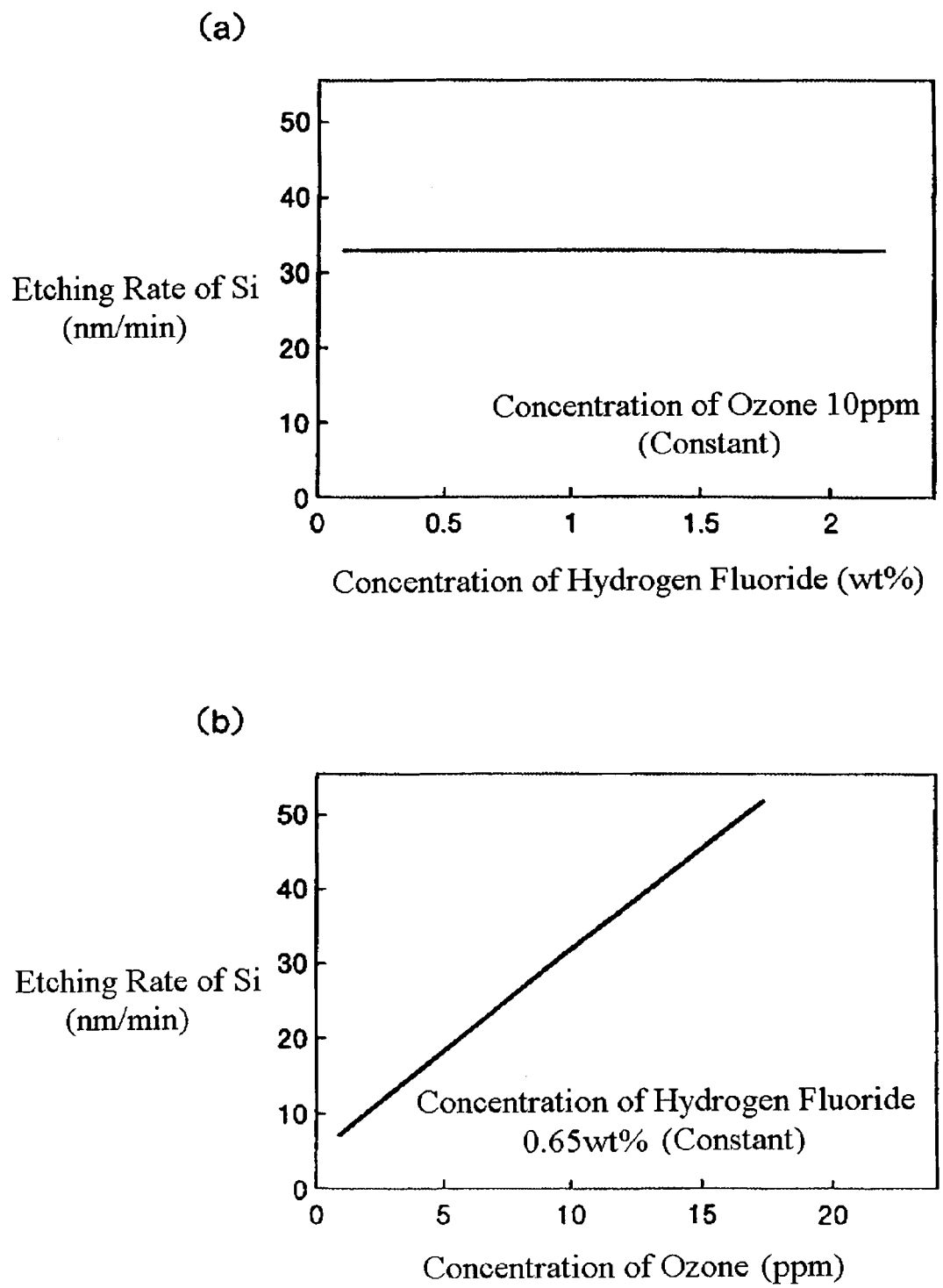
FIG. 4 is a graph which shows relation between a change of an etching rate of silicon and the concentration of hydrogen fluoride and the concentration of ozone in an etchant.
Figure 5:
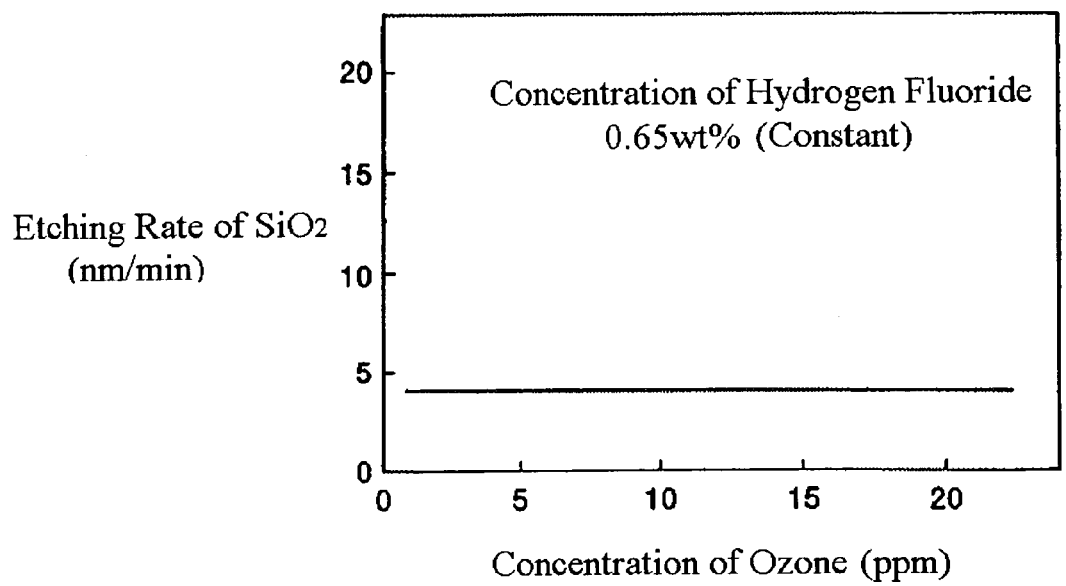
FIG. 5 is a graph which shows relation between a change of an etching rate of SiO$_2$ and the concentration of hydrogen fluoride and the concentration of ozone in an etchant.
Figure 5:
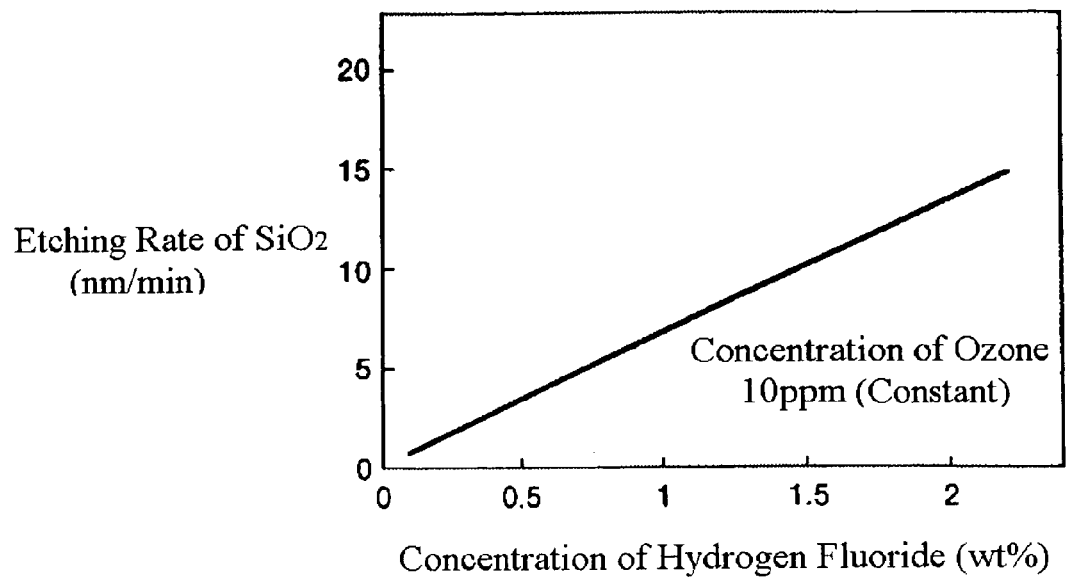

The ratio of the etching rates ($R_1/R_2$) depends largely on the concentration of hydrogen fluoride and the concentration of ozone in the etchant and the like. FIG. 4 is a graph which shows relation between a change of an etching rate of silicon and the concentration of hydrogen fluoride and the concentration of ozone in the etchant, and FIG. 5 is a graph which shows relation between a change of an etching rate of $SiO_2$ and the concentration of hydrogen fluoride and the concentration of ozone in the etchant.

The concentration of ozone in the etchant has an influence on the etching rate of the substrate (silicon) 20 mainly. Namely, as shown in FIG. 4(a), in the case where the concentration of ozone in the etchant is constant, the etching rate of silicon does not change even though the concentration of hydrogen fluoride is changed. As shown in FIG. 4(b), in the case where the concentration of hydrogen fluoride in the etchant is constant and the concentration of ozone is changed, the etching rate of silicon changes dependent on the concentration of ozone.

On the other hand, the concentration of hydrogen fluoride in the etchant has an influence on the etching rate of insulating material ($SiO_2$) 40 mainly. Namely, as shown in FIG. 5(a), in the case where the concentration of hydrogen fluoride in the etchant is constant, the etching rate of $SiO_2$ does not change even though the concentration of ozone is changed. As shown in FIG. 5(b), in the case where the concentration of ozone in the etchant is constant and the concentration of hydrogen fluoride is changed, the etching rate of $SiO_2$ changes dependent on the concentration of hydrogen fluoride.

Therefore, by appropriately setting the concentration of hydrogen fluoride or ozone, it is possible to adjust the value of $R_1/R_2$ within the range described above.

More specifically, it is preferable that the concentration of hydrogen fluoride in the etchant is in the range of about 0.05 to 5% by weight, and more preferably it is in the range of about 0.15 to 2% by weight. Further, it is preferable that the concentration of ozone in the etchant is in the range of about 1 to 50 ppm, and more preferably it is in the range of about 3 to 30 ppm.

Hydrogen fluoride and ozone can be dissolved in a solvent used in such an etchant. Any solvent may be used in such an etchant as long as the solvent has a relatively low boiling point. As such a solvent, for example, various kinds of water such as distilled water, ion-exchange water, pure water, ultrapure water, and reverse osmosis water; lower alcohols such as methanol and ethanol, acetone, ethyl and ethyl acetate may be mentioned. One kind of them or a combination of two or more kinds of these elements can be utilized. It is preferable that any one including water among them is used as the solvent. This makes it possible to improve the etching rates to silicon and $SiO_2$ further.

Furthermore, it is preferable that the temperature of the etchant in the etching process is in the range of about 0 to 100° C., and more preferably it is in the range of about 20 to 50° C. In particular, it is preferable that the etching process is carried out while the temperature of the etchant is held at a state in which the temperature is substantially constant within the range described above (that is, a change of the temperature is small). Thus, it is possible to form steps 41 surely and with high dimensional accuracy while preventing the time required to form the steps 41 between the substrate 20 and the insulating material 40 from being increased.

Under the conditions for the etching process described above, the etchant is brought into contact with the surface 23 of the substrate 20 until the height H of the step 41 becomes a predetermined height (that is, a height required for the method of manufacturing a semiconductor device at a subsequent step). In this regard, it is possible to adjust the height H of the step 41 by appropriately setting at least one condition of the concentration of hydrogen fluoride in the etchant, the concentration of ozone in the etchant, the temperature of the etchant, and a processing time by the etchant (that is, time to bring the surface 23 of the substrate 20 into contact with the etchant).

Since the height H of the step 41 somewhat changes in accordance with the type of semiconductor apparatus or the like, it is not particularly limited. In the present embodiment, it is preferable that the height H of the step 41 is in the range of about 5 to 150 nm, and more preferably it is in the range of about 20 to 100 nm. In the case where the height H of the step 41 becomes too low, there is fear that isolation for devices by the insulating portions 4 (that is, device isolation region 21) becomes incomplete. On the other hand, in the case where the height H of the step 41 becomes too high, for example, there is fear that failure of patterning formation occurs due to shift of focus in the photolithography method when forming the gate electrode 53 thereon by patterning poly-silicon at a subsequent step.

In this regard, although the case where the etchant containing hydrogen fluoride and ozone is used as an etching agent has been described in the present embodiment, a gas including hydrogen fluoride (hydrogen fluoride gas) and ozone can be used as the etching agent. In this case, from the point of view to heighten the etching rate to silicon and $SiO_2$, it is preferable to mix water vapor in the gas used as the etching agent.

Through the steps described above, the semiconductor substrate 2 of the present invention is obtained.

<7A> Step of Forming Semiconductor Device

Next, a MOS transistor (semiconductor device 5) is formed within each of the device forming regions 22 of the semiconductor substrate 2.

First, predetermined kinds of impurity ions are implanted substantially all over the device forming regions 22 by means of ion implantation using a resist mask formed by means of a photolithography method. Thus, wells are formed in the vicinity of the surface 23 of the substrate 20. A thermal oxidation film is then formed by means of, for example, a thermal oxidation method so as to cover all over the surface 23 side of the substrate 20.

Next, for example, a poly-silicon film is formed on the thermal oxidation film by means of a CVD method or the like.

Next, the poly-silicon film is patterned in the form of the gate electrode 53 using a photolithography method and a dry etching process, for example. Thus, the gate electrode 53 is formed.

Next, after forming a silicon oxide film by means of a CVD method, for example, so as to cover all over the surface 23 side of the substrate 20, the surface 23 of the substrate 20 is subjected to etchback by means of a dry etching process, for example. Thus, a side surface insulating film 56 is formed at each of side surfaces of the gate electrode 53.

Next, predetermined kinds of impurity ions are implanted in predetermined portions of the device forming region 22 (that is, well) by means of ion implantation using the gate electrode 53 on which the side surface insulating film 56 has been formed and the insulating portions 4 (that is, trench isolation structure 21) as a mask. Thus, a source 54 and a drain 55 (that is, impurity diffusion layers) are formed in the vicinity of the surface 23 of the substrate 20.

Next, wiring (including a source electrode and a drain electrode, not shown in the drawings) to be connected to the source 54 and the drain 55 is formed.

Through the steps described above, the MOS transistor is formed within each of the device forming regions 22 of the semiconductor substrate 2, whereby the semiconductor apparatus 1 of the present invention is obtained. As described above, in the semiconductor substrate 2, it is possible to prevent the corner portions from being generated at the boundaries of the trench isolation structure 21 (insulating portions 4) of the device forming regions 22. This prevents concentration of an electric field to the gate electrode 53 from occurring in the vicinity of the boundaries, and therefore it is possible to prevent (or control) a leakage current from flowing in the side surface insulating film 56 or the like. Thus, it is possible to obtain the MOS transistor (semiconductor apparatus 1) with excellent performance.

As described above, according to the present invention, the step is formed between the first region constituted from silicon as a main material and the second region constituted from $SiO_2$ as a main material using a feature that an etching rate of silicon by an etching agent is higher than an etching rate of $SiO_2$ by the etching agent, whereby the trench isolation structure and the device forming regions are formed. For this reason, it is no need to provide a SiN film or the like at the regions for forming the trench isolation structure and the device forming regions in order to form the step in advance, as a conventional method of forming a trench isolation structure.

Therefore, since formation and elimination of the SiN film are not required, it is possible to simplify the method of manufacturing the semiconductor apparatus 1.

Further, since the SiN film is not provided, dishing due to the difference between an etching rate of the SiN film and an etching rate of the $SiO_2$ film depending on the area ratio thereof does not occur in the $SiO_2$ film. Thus, it is possible to form the device forming regions 21 each having an accurate shape, and this makes it possible to isolate the adjacent semiconductor devices 5 surely. Therefore, it is possible to ensure stability of the step (or process) on which the step 41 influences, for example, a photolithography method at the subsequent step.

<<Second Manufacturing Method>>

Next, an explanation will now be given for a second manufacturing method of the semiconductor apparatus 1.

Hereinafter, an explanation will be given for the second manufacturing method of the semiconductor apparatus 1; however, differences between the first manufacturing method described above and the second manufacturing method are chiefly described, and the description of the similar portions is omitted. The second manufacturing method of the semiconductor apparatus 1 is similar to the first manufacturing method of the semiconductor apparatus 1 except for an etching agent to be used at the step of exposing the substrate.

<1B> Step of Forming Pad Oxide Film

The step similar to the step <1A> described above is carried out.

<2B> Step of Forming Trench (First Step)

The step similar to the step <2A> described above is carried out.

<3B> Step of Supplying Insulating Material (Second Step)

The step similar to the step <3A> described above is carried out.

<4B> Step of Flattening (Third Step)

The step similar to the step <4A> described above is carried out.

<5B> Step of Exposing Substrate (Fourth Step)

In the present embodiment, the insulating material 40 and the pad oxide film 6 are eliminated using an etchant (etching agent) containing hydrogen fluoride and ozone, for example.

Although the concentration of hydrogen fluoride and/or the concentration of ozone in the etchant are different from those in the etchant at the subsequent step <6B>, it is preferable that the concentration of hydrogen fluoride and the concentration of ozone in the etchant were the same as those at the step <6B> (namely, the etchant at the step <5B> was the same as the etchant at the step <6B>). This makes it possible to carry out the steps <5B> and <6B> in succession, and therefore it is possible to simplify the method of manufacturing the semiconductor substrate 2 (that is, semiconductor apparatus 1) further.

In this case, it is preferable that the temperature of the etchant in the etching process is the same as (or similar to) the temperature of the etchant at the step <6A> described above.

In this regard, although the case where the etchant containing hydrogen fluoride and ozone is used as an etching agent has been described in the present embodiment, a gas including hydrogen fluoride (hydrogen fluoride gas) and ozone can be used as the etching agent. In this case, from the point of view to heighten the etching rate to silicon and $SiO_2$, it is preferable to mix water vapor in the gas used as the etching agent.

<6B> Step of Forming Step (Fifth Step)

The step similar to the step <6A> described above is carried out.

<7B> Step of Forming Semiconductor Device

The step similar to the step <7A> described above is carried out.

Even in the second manufacturing method, the functions (or operation) and effects similar to those in the first manufacturing method can be obtained.

The etching method, the method of forming a trench isolation structure, the semiconductor substrate and the semiconductor apparatus according to the present invention have been described based on the embodiments shown in the drawings, but it should be noted that the present invention is not limited to the embodiments. For example, other one or more step can be added to the etching method of the present invention if necessary. Further, the etching method of the present invention is not limited to application to the case of forming a trench isolation structure. It is suitable to apply the etching method of the present invention to the case where in a base material having a region constituted from silicon as a main material and a region constituted from SiO$_2$ as a main material a selection etching process to the region constituted from silicon as a main material is required.

EXAMPLE

Next, a concrete example of the present invention will be described.

Example

First, a p type single crystal silicon substrate having the orientation of (100) (hereinafter, referred to simply as "silicon substrate") was prepared.

<1> Next, the silicon substrate was subjected to a thermal oxidation process in which the silicon substrate was heated at 900° C. for 20 minutes under the atmosphere including O$_2$ and N$_2$. Thus, a SiO$_2$ film (that is, pad oxide film) having an average thickness of 10 nm was formed on the surface of the silicon substrate.

<2> Next, a resist layer shaped of having openings respectively corresponding to device forming regions was formed on the SiO$_2$ film by means of a photolithography method. The SiO$_2$ film and silicon substrate were eliminated by means of a reactive ion etching method using the resist layer as a mask. Thus, trenches each having a depth of 400 nm from the surface of the silicon substrate were formed.

<3> Next, after eliminating the resist layer, an insulating material (SiO$_2$) was supplied onto the silicon substrate by means of a plasma CVD method so as to fill within each of the trenches. The average thickness of SiO$_2$ except for the inside of each of the trenches was set to 550 nm.

<4> Next, by eliminating a part of SiO$_2$ by means of a CMP method, the surface side of the insulating material was flattened.

<5> Next, SiO$_2$ (that is, insulating material and pad oxide film) was eliminated (that is, it was subjected to an etching process) with a substantially constant thickness using a mixed solution (etchant) containing hydrogen fluoride and ozone. Thus, the surface of the silicon substrate was exposed. In this regard, the etching process was carried out under the conditions in which the concentration of hydrogen fluoride in the etchant was 0.5% by weight, the concentration of ozone in the etchant was 10 ppm, and the temperature of the etchant was 23° C.

<6> Next, the surface of the silicon substrate was subjected to an etching process using a mixed solution (etchant) containing hydrogen fluoride and ozone. Thus, steps each having a height of 10 nm were formed between the SiO$_2$ and the silicon substrate, whereby a semiconductor substrate having a trench isolation structure was obtained. In this regard, the etching process was carried out under the conditions in which the concentration of hydrogen fluoride in the etchant was 0.5% by weight, the concentration of ozone in the etchant was 10 ppm, and the temperature of the etchant was 23° C. Further, the ratio ($R_1/R_2$) of between the etching rate $R_1$ of silicon by the etchant and the etching rate $R_2$ of SiO$_2$ by the etchant was 20.

<7> Next, a gate insulating film, a gate electrode, an upper surface insulating layer and a side surface insulating layer were formed on the silicon substrate. A source region and a drain region were then formed at predetermined regions by ion implantation of As (arsenic) ion. Finally, wiring to be connected to the source and drain regions was formed. Thus, a semiconductor apparatus having a plurality of MOS transistors shown in FIG. 1 was manufactured.

Comparative Example

First, a p type single crystal silicon substrate having the orientation of (100) (hereinafter, referred to simply as "silicon substrate") was prepared.

<1'> Next, the step similar to the step <1> described above was carried out. Subsequently, the silicon substrate was subjected to a LP-CVD method at 780° C. for 50 minutes. Thus, a SiN film having an average thickness of 130 nm was formed on the SiO$_2$ film.

<2'> Next, the step similar to the step <2> described above was carried out. Thus, trenches each having a depth of 400 nm from the surface of the silicon substrate were formed.

<3'> Next, the step similar to the step <3> described above was carried out.

<4'> Next, the step similar to the step <4> described above was carried out using the SiN film as a stopper.

<5'> Next, the SiN film was eliminated using a thermal phosphoric acid solution at 160° C.

<6'> Next, SiO$_2$ (that is, insulating material and pad oxide film) was eliminated (that is, it was subjected to an etching process) with a substantially constant thickness using a hydrogen fluoride solution (etchant). Thus, steps each having a height of 50 nm were respectively formed boundaries between the SiO$_2$ and the silicon substrate, whereby a semiconductor substrate having a trench isolation structure was obtained. In this regard, the etching process was carried out under the conditions in which the concentration of hydrogen fluoride in the etchant was 0.5% by weight, and the temperature of the etchant was 23° C.

<7'> Next, the step similar to the step <7> described above was carried out. Thus, a semiconductor apparatus having a plurality of MOS transistors similar to one shown in FIG. 1 was manufactured.

(Evaluation)

Figure 6:
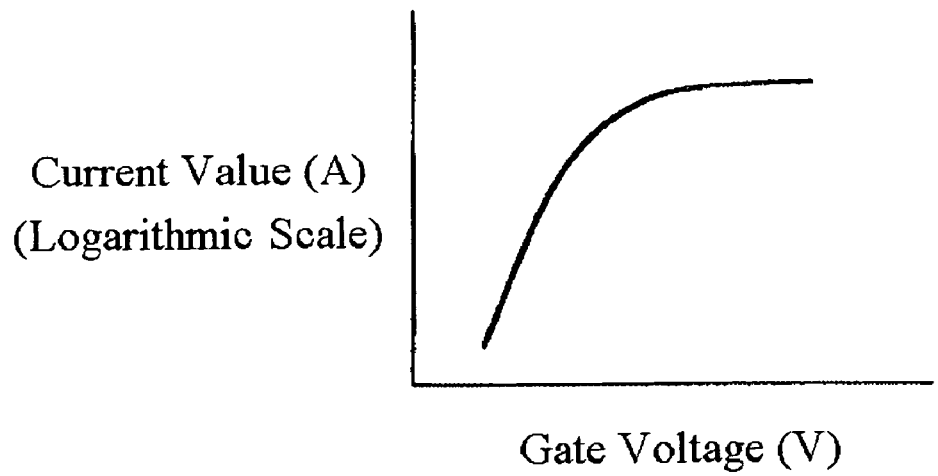
FIG. 6 is a graph which shows transistor characteristics of a semiconductor apparatus manufactured in an example.
Figure 7:
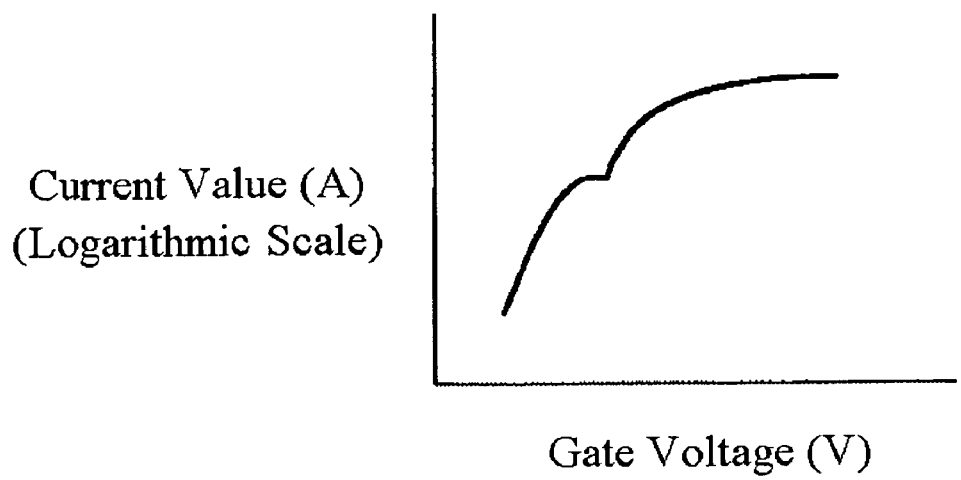
FIG. 7 is a graph which shows transistor characteristics of a semiconductor apparatus manufactured in a comparative example.
Figure 8:
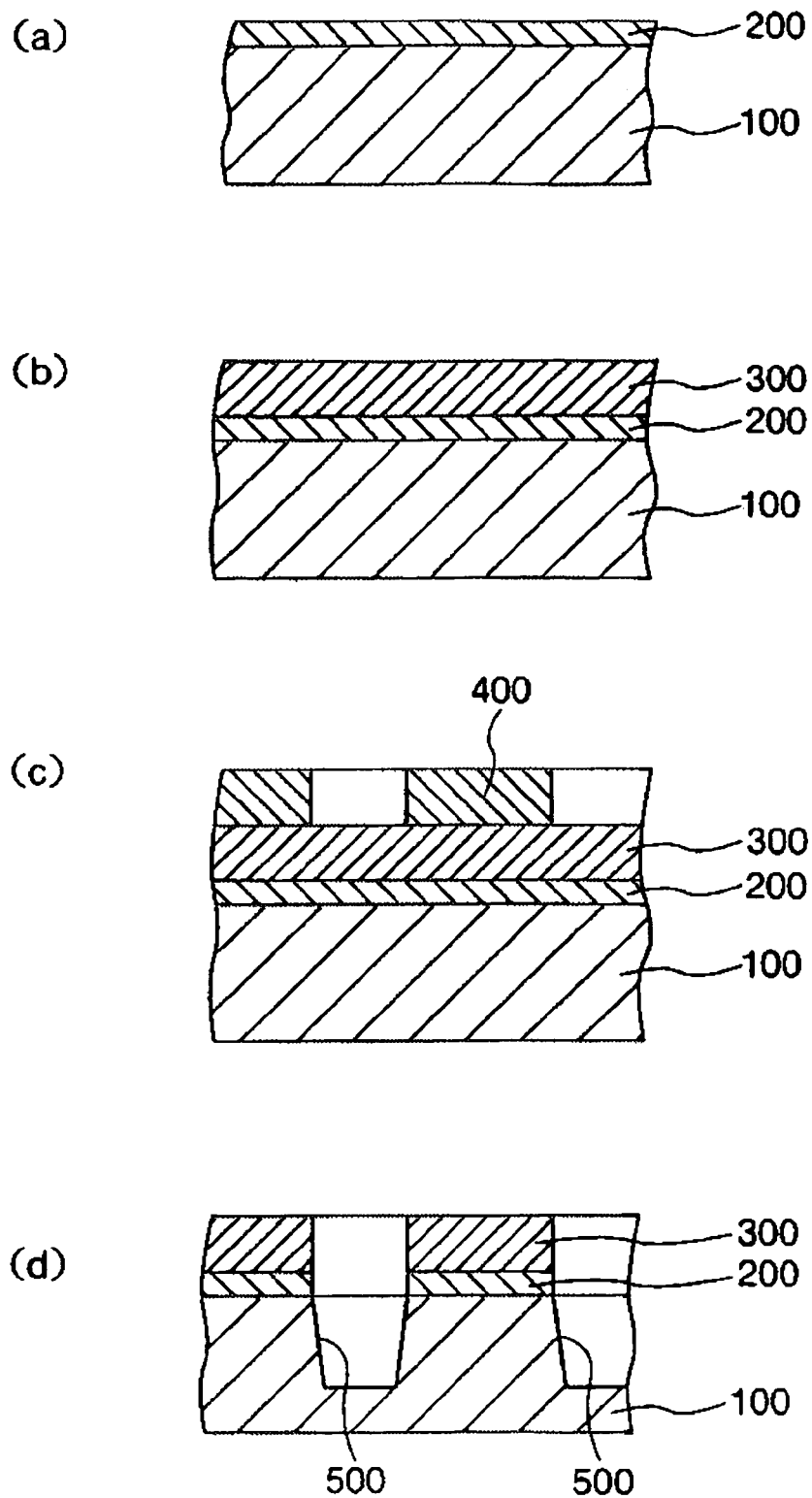
FIG. 8 is a drawing (vertical cross-sectional view) for explaining a conventional method of forming a semiconductor apparatus.
Figure 8:
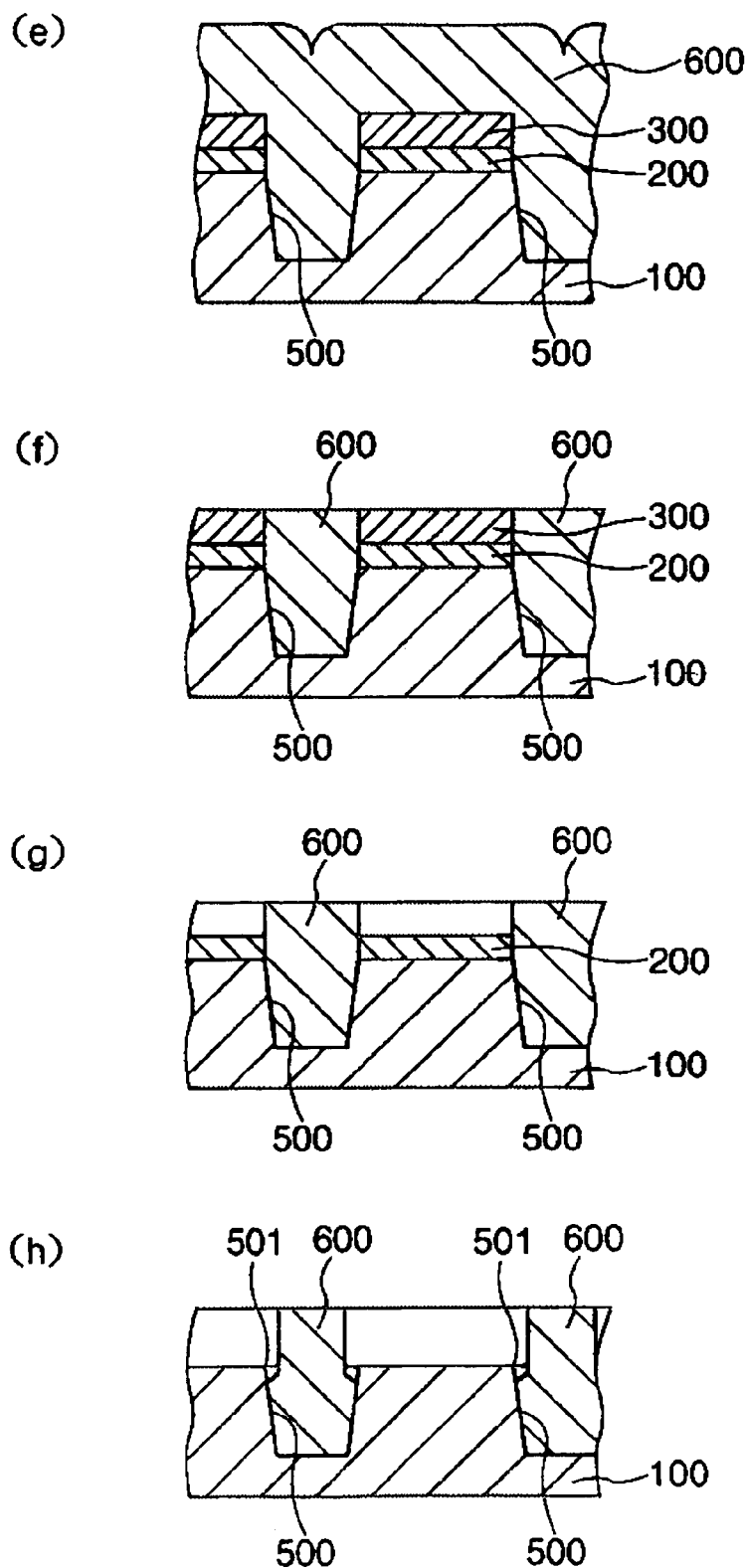

By changing a voltage value applied to a gate electrode of each of the semiconductor apparatuses manufactured in Example and Comparative Example, changes of current values flowing between a source electrode and a drain electrode (that is, transistor characteristics) were measured. These results were shown in FIGS. 6 and 7. FIG. 6 is a graph which shows transistor characteristics of the semiconductor apparatus manufactured in Example. FIG. 7 is a graph which shows transistor characteristics of a semiconductor apparatus manufactured in Comparative Example. In this regard, in FIGS. 6 and 7, each horizontal axis thereof indicates a voltage value applied to the gate electrode (gate voltage: V), and each longitudinal axis indicates a current value (A) flowing between the source electrode and the drain electrode (as a logarithmic scale).

As shown in FIG. 6, in the semiconductor apparatus manufactured in Example, the change of the current value with respect to the change of the gate voltage was shown as a gentle and smooth curved line.

On the other hand, as shown in FIG. 7, in the semiconductor apparatus manufactured in Comparative Example, a diphasic feature was found in the change of the current value with respect to the change of the gate voltage. As a result, this indicates the probability of occurrence of a leakage current.

What is claimed is:

1. A method of forming a trench isolation structure on the surface of a semiconductor substrate, the semiconductor substrate being constituted from Si as a main material, the method comprising the steps of:

a first step at which trenches are formed on the surface of the semiconductor substrate;

a second step at which an insulating material is supplied onto the surface of the semiconductor substrate to fill in the trenches with the insulating material, the insulating material being constituted from $SiO_2$ as a main material;

a third step at which the surface side of the insulating material is flattened by eliminating a part of the insulating material;

a fourth step at which the surface of the semiconductor substrate is exposed while maintaining a state that the insulating material is filled in the trenches by eliminating the insulating material by a substantially constant thickness; and a fifth step at which an etching agent is supplied onto the surfaces of the semiconductor substrate and the insulating material filled in the trenches to form a step between the semiconductor substrate and the insulating material, an etching rate of Si by the etching agent is higher than an etching rate of $SiO_2$ by the etching agent, so that the height of the surface of the semiconductor substrate is lower than the height of the surface of the insulating material, thereby obtaining the trench isolation structure.

2. The method as claimed in claim 1, wherein in the fifth step the etching agent includes an etchant containing hydrogen fluoride and ozone.

3. The method as claimed in claim 2, wherein, in the case where the etching rate of Si by the etchant is defined as $R_1$ and the etching rate of $SiO_2$ by the etchant is defined as $R_2$, then $R_1$ and $R_2$ satisfy the relation: $R_1/R_2$ is in the range of 1.2 to 200.

4. The method as claimed in claim 3, wherein the concentration of hydrogen fluoride in the etchant is in the range of 0.05 to 5% by weight.

5. The method as claimed in claim 3, wherein the concentration of ozone in the etchant is in the range of 10 to 50 ppm.

6. The method as claimed in claim 2, wherein the temperature of the etchant is in the range of 0 to 100° C.

7. The method as claimed in claim 2, wherein the etchant is prepared by dissolving hydrogen fluoride and ozone in water.

8. The method as claimed in claim 1, wherein the fifth step includes the step of adjusting the height of the step to be formed between the semiconductor substrate and the insulating material by setting conditions of at least one of the concentration of hydrogen fluoride in the etching agent, the concentration of ozone in the etching agent, the temperature of the etching agent and a processing time by the etching agent.

9. The method as claimed in claim 1, wherein the elimination of the insulating material at the third step is carried out by means of a CMP (Chemical Mechanical Polishing) method.

10. The method as claimed in claim 1, wherein the elimination of the insulating material at the fourth step is carried out using an etching agent containing hydrogen fluoride.

11. The method as claimed in claim 10, wherein the etching agent further contains ozone.

12. The method as claimed in claim 11, wherein the fourth step and the fifth step are carried out using the same etching agent.

13. The method as claimed in claim 1, further comprising the step of oxidizing the surface of the semiconductor substrate and/or the step of forming an oxide film on the surface of the semiconductor substrate prior to the first step, the oxide film being constituted from $SiO_2$ as a main material.

14. The method as claimed in claim 1, wherein the surface orientation of the semiconductor substrate is Si(100).

15. A semiconductor substrate constituted from Si as a main material, comprising:

a trench isolation structure formed on the surface of the semiconductor substrate using the method defined by claim 1; and a plurality of regions for forming devices, the regions being separately formed by means of the trench isolation structure.

16. A semiconductor apparatus comprising:

the semiconductor substrate defined by claim 15; and a plurality of semiconductor devices respectively formed in the regions for forming devices of the semiconductor substrate.

17. The method as claimed in claim 1, wherein in the fifth step the etching agent includes a gas containing hydrogen fluoride, ozone and water vapor.

* * * * *

UNITED STATES PATENT AND TRADEMARK OFFICE
CERTIFICATE OF CORRECTION

| | | |
|---|---|---|
| PATENT NO. | : 7,365,012 B2 | Page 1 of 1 |
| APPLICATION NO. | : 11/201266 | |
| DATED | : April 29, 2008 | |
| INVENTOR(S) | : Hiroyuki Matsuo, Toshiki Nakajima and Kunihiro Miyazaki | |

It is certified that error appears in the above-identified patent and that said Letters Patent is hereby corrected as shown below:

Title Page, page 2, FOREIGN PATENT DOCUMENTS, Line 3: "2001-218085" should be -- 2003-218085 --.

Col. 1, line 24: after "respond" insert -- to --.

Col. 1, line 56: "apad" should be -- a pad --.

Col. 2, line 48: "incompletely," should be -- incomplete, --.

Col. 6, line 54: after "conducting" insert -- with --.

Col. 6, line 62: after "spaced" insert -- from --.

Col. 7, line 12: "flow" should be -- flows --.

Col. 10, line 46: "an" should be -- a --.

Col. 10, line 49: "an" should be -- a --.

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO.         : 7,365,012 B2
APPLICATION NO. : 11/201266
DATED                 : April 29, 2008
INVENTOR(S)       : Hiroyuki Matsuo, Toshiki Nakajima and Kunihiro Miyazaki It is certified that error appears in the above-identified patent and that said Letters Patent is hereby corrected as shown below:

Title Pg, Item (73) Assignee: Line 2:   add -- Kabushiki Kaisha Toshiba (JP) --.

Signed and Sealed this

Second Day of June, 2009

JOHN DOLL
*Acting Director of the United States Patent and Trademark Office*